United States Patent
Naruse et al.

(10) Patent No.: US 7,224,066 B2
(45) Date of Patent: May 29, 2007

(54) BONDING MATERIAL AND CIRCUIT DEVICE USING THE SAME

(75) Inventors: Toshimichi Naruse, Gunma (JP); Yoshihiro Kogure, Gunma (JP); Takayuki Hasegawa, Gunma (JP); Hajime Kobayashi, Saitama (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/925,182

(22) Filed: Aug. 24, 2004

(65) Prior Publication Data

US 2005/0046032 A1  Mar. 3, 2005

(30) Foreign Application Priority Data

Aug. 26, 2003 (JP) .......................... P.2003-208741
Jul. 28, 2004 (JP) .......................... P.2004-220780

(51) Int. Cl.
*H01L 23/48* (2006.01)
*H01L 23/52* (2006.01)
*H01L 29/40* (2006.01)

(52) U.S. Cl. ...................... 257/772; 257/779; 257/781; 257/782; 257/762; 257/765; 257/766; 257/E23.015; 257/E21.508; 257/E21.509; 257/E21.519

(58) Field of Classification Search ..................... None
See application file for complete search history.

(56) References Cited

U.S. PATENT DOCUMENTS

| 4,098,452 | A  | * | 7/1978 | Webster et al. .......... 228/123.1 |
| 6,563,225 | B2 | * | 5/2003 | Soga et al. .................. 257/782 |
| 6,853,077 | B2 | * | 2/2005 | Oida et al. .................. 257/738 |
| 6,884,389 | B2 | * | 4/2005 | Takahashi .................... 420/562 |
| 6,926,191 | B2 | * | 8/2005 | Grigg et al. ........... 228/180.22 |
| 2005/0029666 | A1 | * | 2/2005 | Kurihara et al. ............. 257/772 |

FOREIGN PATENT DOCUMENTS

| JP | 55-72046    | * | 11/1978 |
| JP | 5-105536    | * | 4/1993 |
| JP | 9-232705    | * | 9/1997 |
| JP | 10-135377   | * | 5/1998 |
| JP | 2001-237272 | * | 8/2001 |

* cited by examiner

*Primary Examiner*—Jasmine Clark
(74) *Attorney, Agent, or Firm*—Fish & Richardson P.C.

(57) ABSTRACT

A circuit device is provided in which the bonding reliability of a brazing material such as soft solder is improved. A circuit device of the present invention includes conductive patterns, a bonding material which fixes circuit elements to the conductive patterns, and sealing resin which covers the circuit elements. The circuit device has a structure in which Pb-free solder containing Bi is used as the bonding material. Since the melting temperature of Bi is high in comparison with that of a general solder, the melting of the bonding material is suppressed when the circuit device is mounted. Further, Ag or the like may be mixed into the bonding material in order to enhance the wettability of the bonding material.

21 Claims, 11 Drawing Sheets

BONDING MATERIAL AND CIRCUIT DEVICE USING THE SAME

BACKGROUND OF THE INVENTION

Priority is claimed to Japanese Patent Application Serial Numbers JP2003-208741, filed on Aug. 26, 2003, and JP2004-220780, filed on Jul. 28, 2004, the disclosures of which are incorporated herein by reference in its entireties.

FIELD OF THE INVENTION

The present invention relates to a circuit device and, more particularly, to a circuit device inside which circuit elements are fixed by using a bonding material such as solder.

DESCRIPTION OF THE RELATED ART

In a general circuit device, solder is used to fix built-in elements. Solder is also used a lot as external electrodes which fix a circuit device itself. An example of a circuit device 100 employing a bonding material 110 will be described with reference to FIG. 11.

A semiconductor element 102A and a chip element 102B are included, as circuit elements, inside the circuit device 100. The semiconductor element 102A is fixed face up to a supporting board 101 and electrically connected to surface electrodes 104 through thin metal wires 103. The chip element 102B is fixed to surface electrodes 104 through the bonding material 110 made of solder. The circuit elements 102 are covered with sealing resin 107.

The surface electrodes 104, formed on the surface of the supporting board 101, and back electrodes 105, formed on the back surface of the supporting board 101, are connected to each other, penetrating the supporting board 101. The circuit device 100 is fixed to conductive paths 108 which are formed on the surface of a mounting substrate 106, through external electrodes 111 which are fixed to the back electrodes 105.

On the other hand, in recent years, there is an urgent need to put Pb (lead)-free solder into practical use. The Pb-free solder is used a lot particularly for the external electrodes ill, which are exposed to the outside.

However, there are some cases where the bonding material 110 melts during a reflow process of melting the external electrodes 111 and thereby mounting the circuit device 100. Since the volume of the bonding material 110 expands by approximately 10% when it melts, cracks occur in the sealing resin 107, which seals the whole device. Moreover, if the molten bonding material 110 enters these cracks and the interfaces between components, a short circuit results. The chip element 102B, in particular, is fixed in such a manner that its electrodes on both ends are fixed through the bonding material 110. Therefore, there is a problem that the molten bonding material 110 penetrates along a lower portion of the chip element 102B and a short circuit results. Further, in some cases, the molten bonding material 110 also penetrates along an upper portion of the chip element 102B.

When Pb-free solder is employed as the external electrodes 111, the temperature during the reflow process is made high. Accordingly, the above-described problem noticeably arises. This is because the melting temperature of the Pb-free solder is generally high, as compared with that of a general Sn—Pb eutectic solder. For example, the melting temperature of Sn-3.0Ag-0.5Cu solder, which is one of typical Pb-free solders, is approximately 217° C. Therefore, when such a Pb-free solder is employed as the external electrodes 111, the temperature of atmosphere during the reflow process is approximately 250° C. Exposing the circuit device 100 to such a high-temperature atmosphere will result in the bonding material 110 inside the circuit device 100 melting.

SUMMARY OF THE INVENTION

The present invention has been achieved in the light of the above-described problem. A preferred embodiment of the present invention provides a circuit device having an improved bonding reliability of a bonding material.

A circuit device of some preferred embodiments includes a circuit element, a conductive pattern, and a bonding material which bonds the circuit element and the conductive pattern, wherein the bonding material contains Bi.

Moreover, in the preferred embodiments, the circuit element, the conductive pattern, and the bonding material are covered with sealing resin.

In the preferred embodiments, the circuit device further includes an external electrode fixed to the conductive pattern, wherein the external electrode is made of Pb-free solder.

In the preferred embodiments, the bonding material contains Bi, Ag and Cu.

In the preferred embodiments, the conductive pattern has a multilayer structure in which a plurality of layers are laminated with an insulating layer, made of resin, interposed therebetween. Further, the melting temperature of the bonding material is higher than the melting temperature of the external electrode, and is lower than the temperature at which the insulating layer is thermally decomposed.

Another circuit device of the preferred embodiments includes a circuit element, a conductive pattern, and a bonding material which bonds the circuit element and the conductive pattern, wherein metal powder is mixed into the bonding material.

In the preferred embodiments, the melting temperature of the metal powder is higher than the melting temperature of the bonding material.

In the preferred embodiments, a metal which forms an intermetallic compound with a metal included in the bonding material, is employed as the metal powder.

In the preferred embodiments, any one of Cu, Ni, Fe, Al, Ag, Au, Sb, and Bi can be employed as the metal powder.

In the preferred embodiments, the metal powder includes particles of different sizes.

In the preferred embodiments, the circuit element is a chip-type element with electrode layers formed on both ends; the electrode layers and the conductive pattern are connected to each other through the bonding material; at least part of the electrode layers is integrated with the bonding material.

A bonding material of some preferred embodiments includes Bi as an essential material.

In the preferred embodiments, the bonding material further comprising Bi, Ag and Cu.

A bonding material of some preferred embodiments includes essentially of solder, and metal powder mixed into the solder.

In the preferred embodiments, melting temperature of the metal powder is higher than a melting temperature of the solder.

In the preferred embodiments, for the metal powder, a metal which forms an intermetallic compound with the solder is employed.

In the preferred embodiments, for the metal powder, a metal selected from the group consisting of Cu, Ni, Fe, Al, Ag, Au, Sb, and Bi is employed.

In the preferred embodiments, the metal powder includes particles with different sizes.

According to the preferred embodiments, a Pb-free solder containing Bi is used as the bonding material which fixes the circuit elements inside the circuit device. Accordingly, even if a Pb-free solder having a high melting temperature is employed as a material of the external electrode, it is possible to suppress the melting of the bonding material in a reflow process in which the circuit device is mounted. This is because the melting temperature of Bi is a high temperature of approximately 270° C. Thus, it is possible to prevent the occurrence of cracks and a short circuit due to the melting of the bonding material inside the device.

Moreover, it is possible to suppress the outflow of the molten bonding material by mixing a metal powder into the bonding material which fixes the circuit element inside the circuit device. This is because most of solder components form an intermetallic compound with the metal powder when the bonding material is melted.

Furthermore, even if the bonding material melts in a reflow process of melting the external electrode, what melts are only the solder components constituting the bonding material. The metal powder contained in the bonding material does not melt and remains as solid. Since only the solder contained in the bonding material melts, the expansion amount of the bonding material is reduced when it melts. Accordingly, the occurrence of cracks in the resin is suppressed.

DETAILED DESCRIPTION OF THE PREFERRED EMBODIMENT

Figure 1A:
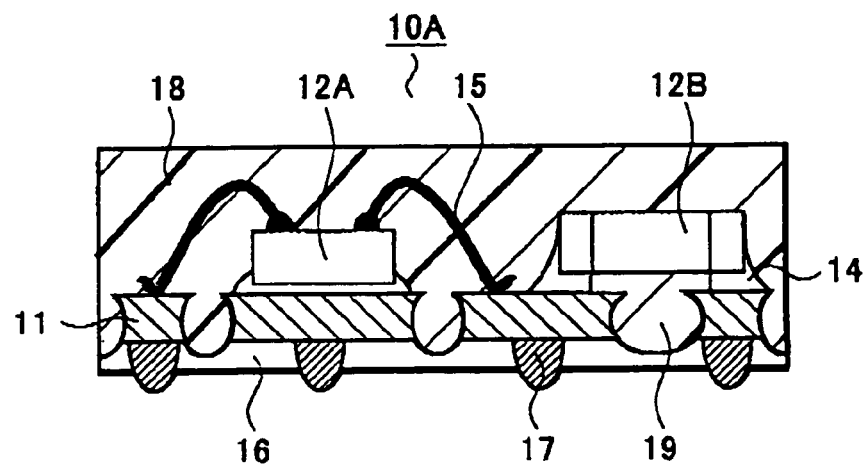
FIGS. 1A to 1C are sectional views, each showing a circuit device of a preferred embodiment.

Referring to FIG. 1A, a circuit device 10A of an embodiment has a structure in which a semiconductor element 12A and a chip element 12B are sealed in with sealing resin 18. The chip element 12B is fixed to conductive patterns 11 through a bonding material 14. In this embodiment, a solder containing Bi can be employed as the bonding material 14.

The conductive patterns 11 are made of metal, such as copper, and buried in the sealing resin 18 with their back surface exposed. Moreover, each conductive pattern 11 is electrically isolated from the others by isolation trenches 19, and the isolation trenches 19 are filled with resin. Each side face of each conductive pattern 11 has a curved shape, and this shape enhances the bonding between the conductive patterns 11 and the sealing resin 18.

The semiconductor element 12A and the chip element 12B are employed as circuit elements 12 here.

For the semiconductor element 12A, an LSI chip, a bare transistor chip, a diode, or the like can be employed. The semiconductor element 12A is fixed with its back surface to the conductive patterns 11 through the bonding material 14. Electrodes on the surface of the semiconductor element 12A and the conductive patterns 11 are electrically connected to each other through thin metal wires 15. In addition, if the back surface of the semiconductor element 12A is insulated, the semiconductor element 12A may be fixed by using an adhesive agent with insulating properties instead of the bonding material 14.

For the chip element 12B, a chip resistor, a chip capacitor, or the like can be employed. Electrodes on both ends of the chip element 12B are fixed to the conductive patterns 11 through the bonding material 14. Moreover, for the chip element 12B, an element having electrode portions on its both ends is employed, such as an inductance, a thermister, an antenna, or an oscillator.

The bonding material 14 is a brazing material such as soft solder and has a function of fixing the circuit elements 12 to the conductive patterns 11. In this embodiment, a solder essentially containing Bi is employed as the bonding material 14. Since Bi is a metal having a very high melting temperature, various problems associated with the melting of the bonding material 14 can be solved. Furthermore, in this embodiment, a solder containing metal powder is employed as the bonding material 14. Details about these will be described later.

The sealing resin 18 is made of thermoplastic resin which is injection-molded, or is made of thermosetting resin which is transfer-molded. Here, the sealing resin 18 has a function of sealing the whole device and also has a function of mechanically supporting the whole device.

External electrodes 17 are made of a brazing material such as soft solder and formed on the back surface of the conductive patterns 11. In general, for the solder forming the external electrodes 17, a solder is employed that has a lower melting temperature than that of the bonding material 14, which fixes the circuit elements 12 inside the device. This can prevent the bonding material 14 from melting during a reflow process in which the circuit device 10A is mounted by melting the external electrodes 17. In addition, a Pb-free solder is used as the external electrodes 17 in some cases. Specifically, those which can be applied include Sn—Ag, Sn—Ag—Cu, Sn—Cu, and Sn—Zn Pb-free solders as well as any of these with the addition of Bi or In. For example, the melting temperature of the Sn—Ag—Cu solder, which is one of Pb-free solders, is approximately 216° C.

Figure 1B:
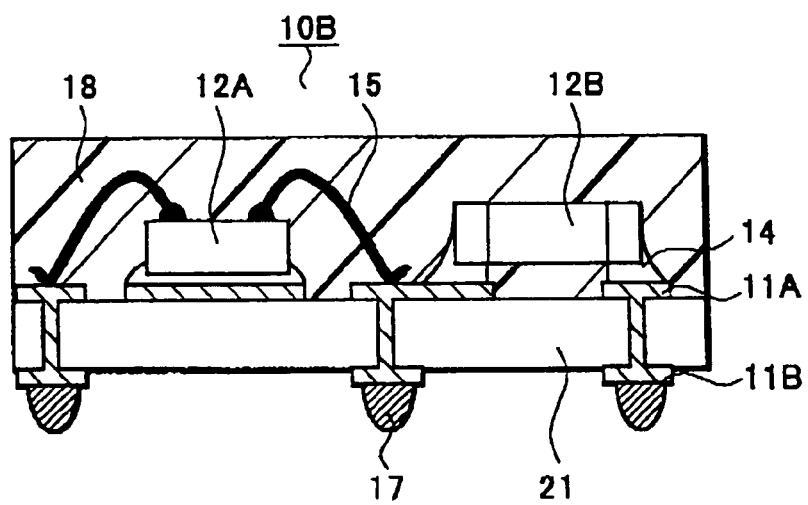

A circuit device 10B of another embodiment will be described with reference to FIG. 1B. The basic structure of the circuit device 10B is similar to that of the above-described circuit device 10A. The different point is that the circuit device 10B has a supporting board 21.

For the supporting board 21, a board is employed which is excellent in heat radiation and has a good mechanical strength. Here, a metal board, a printed wiring board, a flexible board, a composite board, or the like can be employed. In addition, when a board made of a conductive material such as metal is employed, the board is insulated from the conductive patterns 11 by providing an insulating layer on the surface of the board.

First conductive patterns 11A and second conductive patterns 11B are formed on the surface and back surface of the supporting board 21, respectively. Penetrating the supporting board 21, the first and second conductive patterns 11A and 11B are electrically connected to each other. Moreover, the external electrodes 17 are formed on the second conductive patterns 11B. The first conductive patterns 11A are connected to the circuit elements 12 through the bonding material 14. The external electrodes 17, made of a brazing material such as soft solder, are formed on the back surface of the second conductive patterns 11B.

Figure 1C:
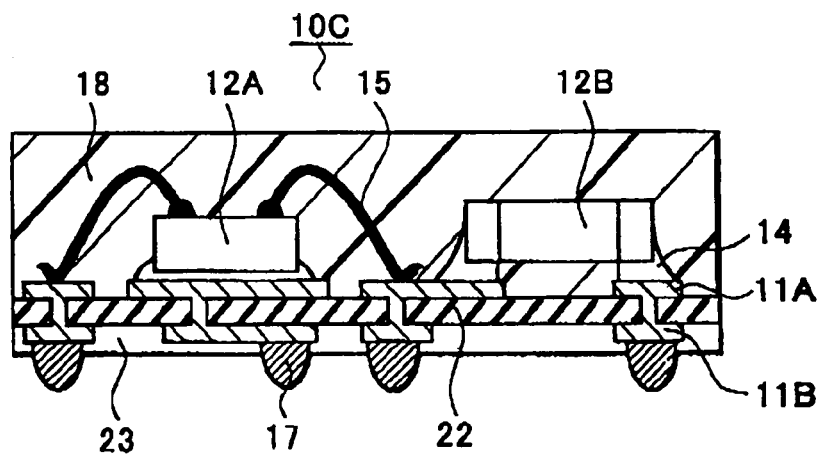

Referring to FIG. 1C, the conductive patterns 11 of a circuit device 10C have a multilayer structure. Specifically, two-layer conductive patterns, including the first and second conductive patterns 11A and 11B, are laminated with an insulating layer 22, made of resin, interposed therebetween. Here, a multilayer structure with three layers or more can be made. The first and second conductive patterns 11A and 11B are electrically connected to each other, penetrating the insulating layer 22.

The point of the embodiment is that a Pb-free solder containing Bi (Bismuth) is used as the bonding material 14, which fixes the circuit elements inside the device. Specifically, when a Pb-free solder is used as an external electrode for constituting the external electrodes 17, the reflow temperature to mount the circuit device 10 is 250° C. or higher because the melting temperature of the Pb-free solder is high. Accordingly, if a solder having a lower melting temperature than this reflow temperature is employed as the bonding material 14, the bonding material 14 melts in the reflow process.

In the embodiment, this problem is solved by employing, as the bonding material 14, a Pb-free solder containing Bi. Since Bi has a melting temperature of 271.4° C., the bonding material 14 does not melt even when reflow is performed at a high temperature of approximately 250° C. According to an experiment, the bonding material 14 containing 90% or more by weight of Bi does not melt even when reflow is performed at the high temperature. Further, Ag, Cu, or Sn may be added to material 14 in order to enhance the wettability of the bonding material 14 with metal such as copper, which is a material of the conductive patterns 11. As an example, the melting temperature of 89.3Bi-9.2Ag-1.8Cu Pb-free solder is 258° C., and this solder is suitable for a material of the bonding material 14. Furthermore, the Pb-free solder with this composition is resistant to corrosion and oxidation, and has an excellent cost/performance ratio.

In addition, Pb-free solder essentially containing Bi is brittle in comparison with other metals. In the embodiment, however, the whole device including the bonding material 14 is sealed with the sealing resin 18. Therefore, it is possible to compensate the brittleness of the Pb-free solder essentially containing Bi with the sealing resin 18.

Preferably, the melting temperature of the bonding material 14 used in the embodiment is lower than the temperature at which a resin material changes in quality. Here, the resin material denotes the supporting board 21 in FIG. 1B or the insulating layer 22 in FIG. 1C. For example, in a case where a solder having a melting temperature of approximately 500° C. is employed as the bonding material 14, the insulating layer 22 is thermally decomposed in a reflow process where the circuit elements 12 are fixed by melting the bonding material 14. Alternatively, the insulating layer 22 is carbonized in some cases. On the other hand, the bonding material 14 of the embodiment, essentially containing Bi, has a melting temperature of approximately 260° C. The bonding material 14 having a melting temperature of around this degree enables the reflow to be performed at a temperature of approximately 300° C. Accordingly, it is possible to perform the fixing of the circuit elements 12 without causing a change in quality of the resin material.

The circuit devices structured without the external electrodes 17 will be described with reference to FIGS. 2A to 2C. Here, each circuit device is structured with an omission of the external electrodes 17, which are connected to the conductive patterns 11. That is, while the circuit devices shown in FIGS. 1A to 1C each have a ball grid allay (BGA) structure, the circuit devices shown in FIGS. 2A to 2C each have a land grid allay (LGA) structure.

Figure 2A:
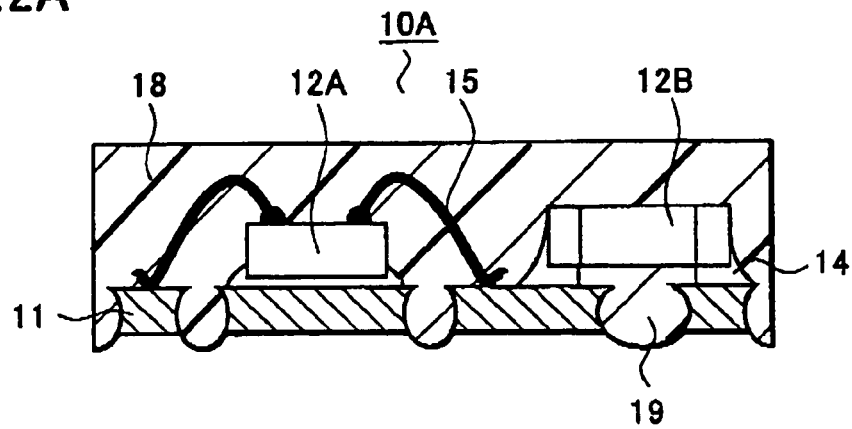
FIGS. 2A to 2C are sectional views, each showing the circuit device of a preferred embodiment.
Figure 2B:
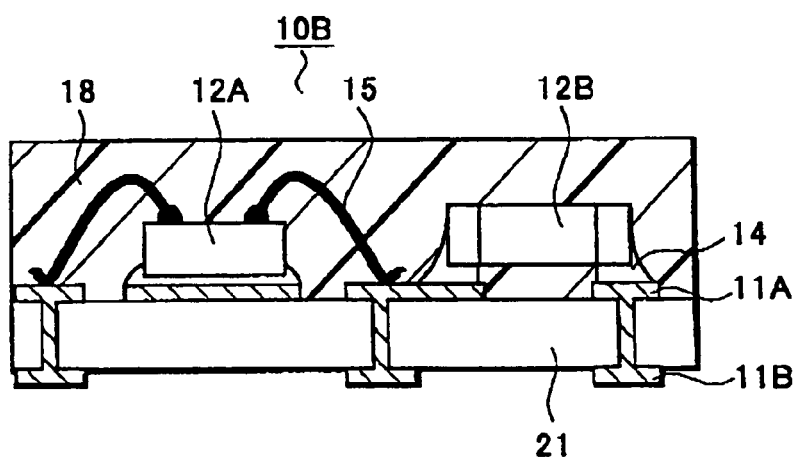
Figure 2C:
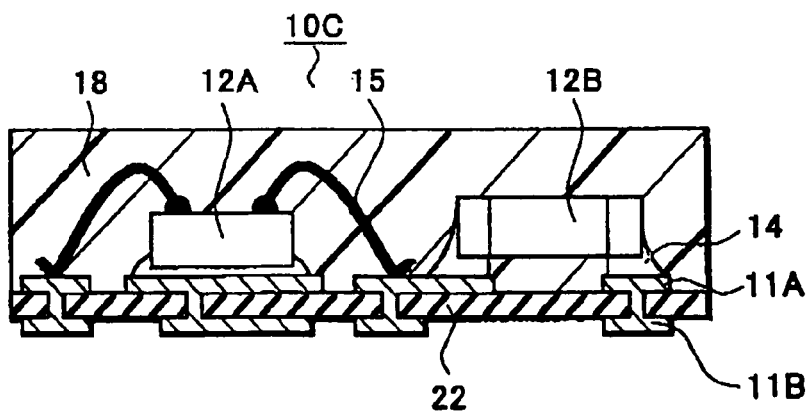

Specifically, the circuit device 10A, a sectional view of which is shown in FIG. 2A, has a structure of the circuit device 10A shown in FIG. 1A from which the external electrodes 17 are omitted. The circuit device 10B shown in FIG. 2B has a structure of the circuit device 10B shown in FIG. 1B from which the external electrodes 17 are omitted. The circuit device 10C shown in FIG. 2C has a structure of the circuit device 10C shown in FIG. 1C from which the external electrodes 17 are omitted.

Moreover, a circuit device structured as described above, having the LGA structure, can be mounted by a reflow process through solder formed on a mounting substrate on which the circuit device is to be mounted.

Figure 3A:
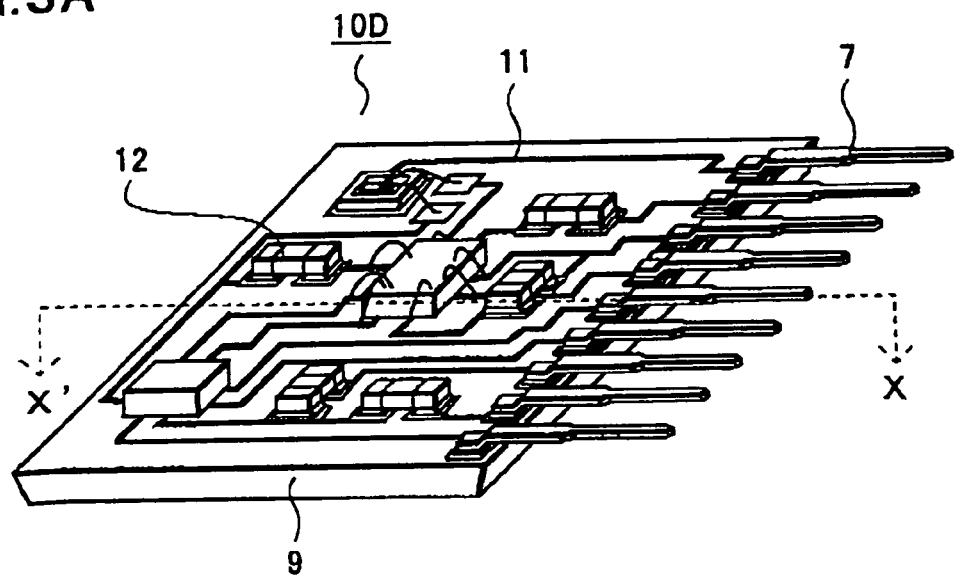
FIGS. 3A to 3C are a perspective view and sectional views, respectively, showing a circuit device of a preferred embodiment.

Referring to FIG. 3A, in a circuit device 10D, the conductive patterns 11 are formed on the surface of a circuit board 9. When the circuit board 9 is a metal board, an insulating layer 8 is formed on the surface of the circuit board 9. Moreover, the circuit elements 12 are fixed to predetermined portions of the conductive patterns 11 through the bonding material 14. In a peripheral portion of the circuit board 9, leads 7 are fixed to the conductive patterns 11. The leads 7 function as external terminals of the whole device.

Figure 3B:
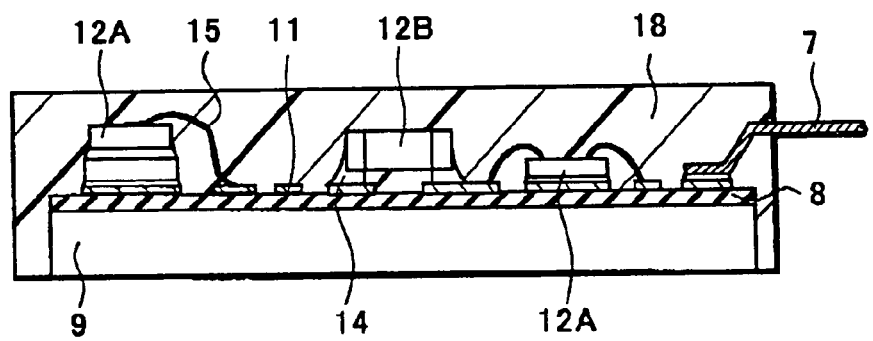

Referring to FIG. 3B, here, the semiconductor elements 12A and the chip element 12B are sealed in with the sealing resin 18. In such a structure as well, it is possible to suppress the problems such as the occurrence of cracks in the sealing resin 18 and a short circuit, by using a solder essentially containing Bi as the bonding material 14, which fixes the chip element 12B and the semiconductor elements 12A.

Figure 3C:
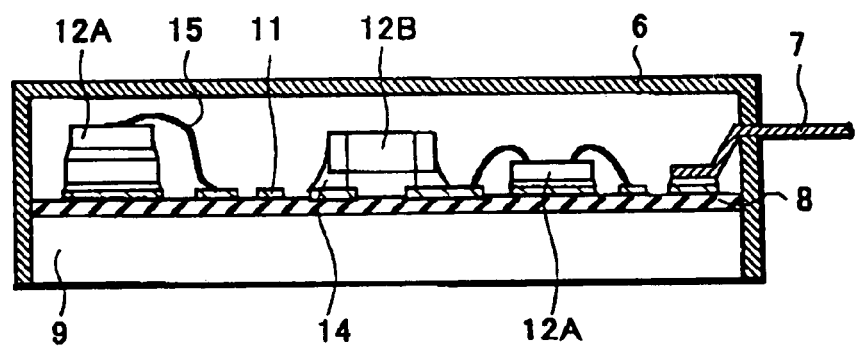

Referring to FIG. 3C, here, an electrical circuit formed on the surface of the circuit board 9 is sealed in with a case material 6. In such a sealing mode other than resin encapsulation as well, it is possible to suppress the problems such as a short circuit due to the flow of solder, by using the bonding material 14 essentially containing Bi.

Figure 4A:
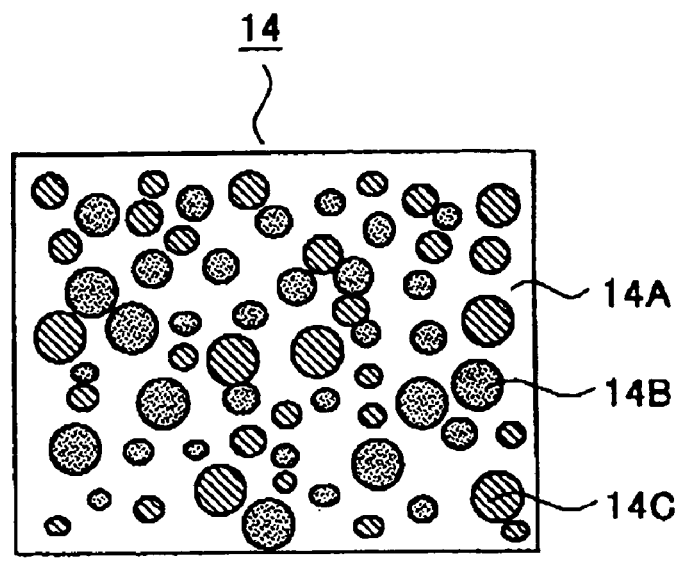
FIGS. 4A and 4B are schematic views, respectively showing compositions of a bonding material used for the circuit devices of a preferred embodiment.
Figure 4B:
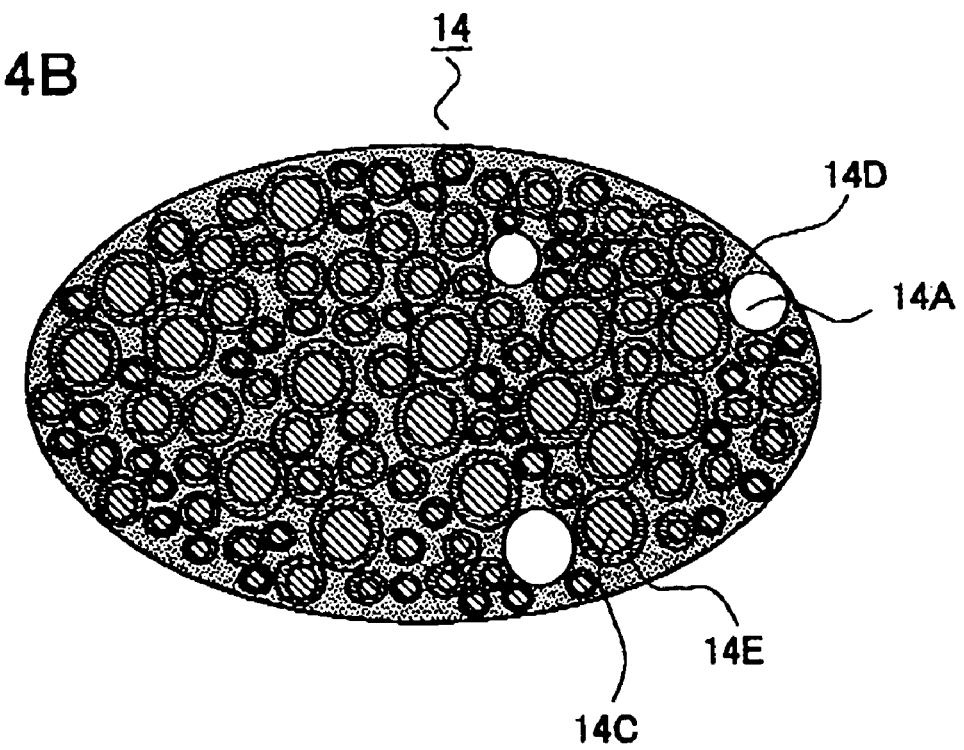

A description will be given of the bonding material 14 mixed with metal powder, with reference to FIGS. 4A and 4B. FIG. 4A is a schematic view of the bonding material 14 in a paste state before being melted, and FIG. 4B is a schematic view of the bonding material 14 after being melted.

Referring to FIG. 4A, here, solder powder 14B and metal powder 14C are mixed into a flux 14A. In the case of a general solder paste, the solder powder 14B is mixed into the flux 14A. In the case of the bonding material 14 of the embodiment, the metal powder 14C is further mixed into this solder paste. Here, the weight ratio of the solder powder 14B to the metal powder 14C, which are to be mixed into the bonding material 14, preferably ranges from 1:1 to 3:2. A weight ratio in this range will enable most of the solder powder 14B to be consumed when the bonding material 14 is melted because an intermetallic compound is formed. Accordingly, it is possible to suppress the outflow of molten solder components. In addition, the above-described weight ratio varies depending on the particle-size distribution and the specific surface area of a metal powder to be used.

For the solder powder 14B, a general Pb eutectic solder or a Pb-free solder can be employed. For the Pb-free solder, Sn—Ag—Cu solder powder 14B or Sn—Sb solder powder 14B can be applied to the embodiment. Further, a solder essentially containing Bi as described earlier can be also applied.

For the flux 14A, a low halogen flux or a halogen-free flux is preferable. Employing such a flux makes it possible to suppress the corrosion of the patterns due to residual flux. Moreover, for the flux 14A, a flux containing thermosetting resin is preferable. This enables the inside of a void to be filled with the resin. Accordingly, it is possible to increase the mechanical strength of the bonding material 14 itself. Here, the "void" means an air-gap formed inside.

For the material of the metal powder 14C, a metal is preferable which forms an intermetallic compound with the solder powder 14B to be used. Since the solder components are integrated with the metal powder 14C by the formation of the intermetallic compound, it is possible to suppress the outflow of the molten solder components. For the specific material of the metal powder 14C, Cu, Ni, Fe, Al, Ag, Au, Sb, Bi, or the like can be employed. Further, a mixture or alloy of any of these metals can be employed as the metal powder 14C. These metals have excellent wettability with respect to solder. Therefore, even when the solder components melt under usage, the wettability of the metal powder 14C can prevent the solder from spreading. Accordingly, it is possible to prevent a short circuit inside the circuit device due to the molten solder.

As for the particle size of the metal powder 14C, it is preferable to use a mixture of particles from ultra-fine particles with a diameter of not more than 1 μm to particles with a diameter of around a few tens of μm. The metal powder 14C of fine-particle components has fine particles and therefore a large specific surface area. Accordingly, the fact that the metal powder 14C of fine-particle components is contained in the bonding material 14 enhances the effect of preventing the bonding material 14 from flowing. Meanwhile, the metal powder 14C of large particles with a diameter of around a few tens of μm has high mechanical strength itself. Accordingly, the fact that the metal powder 14C of large particles is contained in the bonding material 14 can increase the strength of the bonding material 14.

Citing a concrete example of the particle-size distribution of the metal powder 14C, the minimum particle size is 0.5 μm and the maximum particle size is 15 μm in the case of a metal powder made of Cu. A curve representing this particle-size distribution shows a peak at a particle size of 5 μm. Employing the metal powder 14C having such a particle-size distribution can bring about the effects as described above.

FIG. 4B is a schematic view showing the composition of the bonding material 14 after being melted by being heated through a reflow process. In this reflow process, the solder powder 14B is melted, while the metal powder 14C remains as solid. The solder components which have melted and liquefied form an intermetallic compound 14E on the surfaces of particles of the metal powder 14C. Specifically, most part of a particle of the metal powder with a diameter of around a few μm becomes the intermetallic compound. The intermetallic compound having a composition of $Cu_6Sn_5$ is formed around the surface layer of the particle of the metal powder. Moreover, the intermetallic compound having a composition of $Cu_3Sn$ is formed inside the particle of the metal powder. In the case of the aforementioned weight ratio (solder powder: metal powder=1:1 to 3:2), almost all the melted solder powder 14C becomes the intermetallic compound 14E. Accordingly, since very little of the solder powder 14C in a state of solder 14D exists, the molten solder components are prevented from flowing.

Further, the bonding material 14 contains the metal powder 14C, which has excellent electrical conductivity and low electrical resistance, and accordingly has high thermal conductivity and also low electrical resistance. Furthermore, metal contacts are kept at the connection interface between the bonding material 14 and the conductive patterns or the circuit elements. Accordingly, it is possible to further reduce the electrical resistance of the bonding material 14.

In some cases, a little amount of the flux 14A remains in the bonding material 14 after being melted. In the embodiment, the flux 14A containing thermosetting resin can also be used. In this case, the fact that the flux 14A remains can reinforce the mechanical strength of the bonding material 14.

Next, a description will be given of a method of mounting the chip element 12B by using the bonding material 14 mixed with metal powder, with reference to FIGS. 5A to 5D.

Figure 5A:
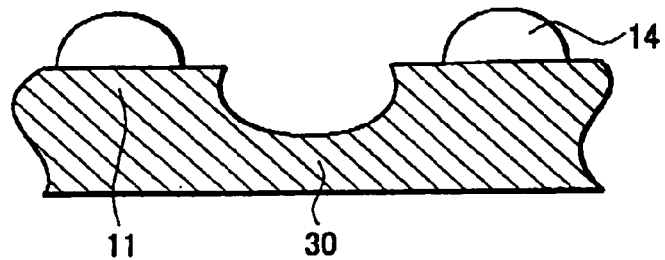
FIGS. 5A to 5D are sectional views showing a circuit device of a preferred embodiment.

First, referring to FIG. 5A, the bonding material 14 is applied on the surfaces of the conductive patterns 11. Here, the bonding material 14 in a paste state as shown in FIG. 4A is applied. Since the bonding material 14 mixed with metal powder has high viscosity, the bonding material 14 is formed in mound-like shapes on the conductive patterns 11. As for the weight ratio of the solder powder to the metal powder contained in the bonding material 14, the proportion of the metal powder is made greater than the aforementioned ratios. Specifically, the weight ratio of the solder powder to the metal powder is made to range from 10:13 to 30:26. That is, the amount of the metal powder is increased by approximately 30%. Increasing the amount of the metal powder to be contained in the bonding material 14 can allow the bonding material 14 to absorb the molten electrode layer of the chip element in a later reflow process. Details thereof will be described below.

Figure 5B:
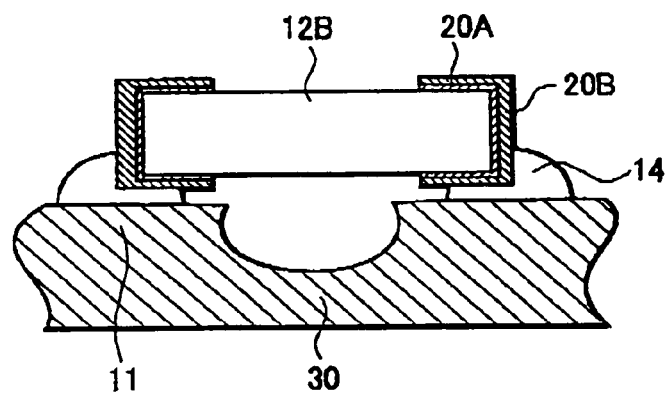

Referring to FIG. 5B, next, the chip element 12B is placed on an upper portion of the bonding material 14. The chip element 12B has electrodes on both ends. Each of these electrodes is composed of a first electrode layer 20A on the inner side and a second electrode layer 20B on the outer side. The first electrode layer 20A is made of a noble metal such as Ag. The second electrode layer 20B is made of a material, such as Sn (tin), having excellent wettability with respect to solder.

Figure 5C:
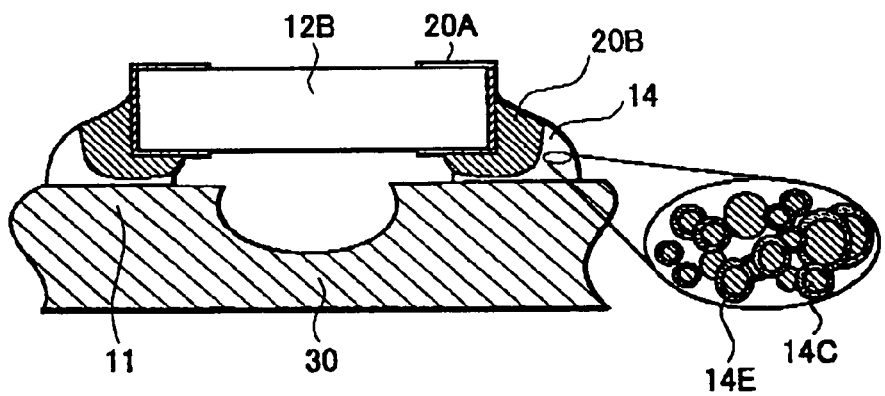
Figure 5D:
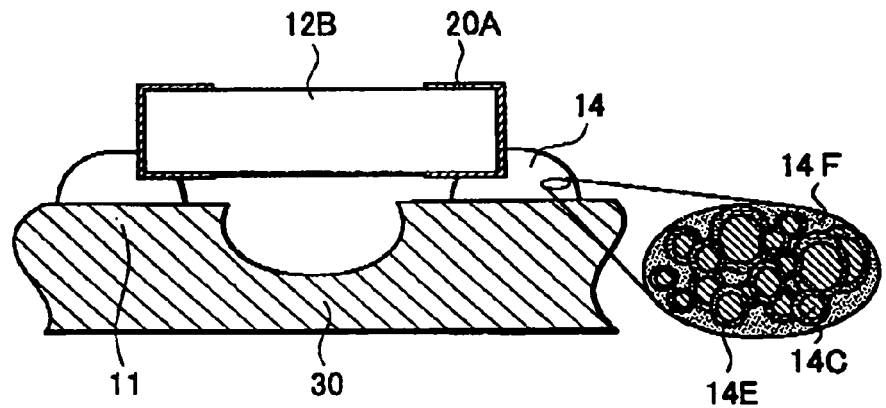

Referring to FIGS. 5C and 5D, next, the chip element 12B is fixed by the reflow process.

FIG. 5C shows a state in a middle step of the reflow process. For example, when the solder powder contained in the bonding material 14 is Sn—Ag—Cu solder, the melting temperature thereof is approximately 220° C. In this process, the reflow temperature is approximately 250° C. in order to surely melt the solder powder. On the other hand, the melting temperature of Sn, which forms the second electrode layer 20B, is 231° C. Therefore, both the bonding material 14 and the second electrode layer 20B melt at this reflow temperature. This drawing shows a state where the molten second electrode layer 20B is being integrated with the bonding material 14. Note that the first electrode layer 20A is made of Ag, Au or the like, each of which has a high melting temperature, and therefore does not melt.

When the bonding material 14 is melted by the reflow process, most of the solder components contained in the bonding material 14 become the intermetallic compound 14E, which is formed on the surfaces of particles of the metal powder 14C. In addition, the bonding material 14 contains a large amount of the metal powder 14C. Therefore, the solder components are not enough to form the intermetallic compound 14E on the surfaces of all the particles of the metal powder 14C. Accordingly, there are particles of the metal powder 14C on the surfaces of which the intermetallic compound 14E is not formed. There are also particles of the metal powder 14C on which the intermetallic compound 14E is formed only partially. Further, since most of the solder components become the intermetallic compound 14E, fine gaps are formed between particles of the metal powder 14C. Furthermore, certain amounts of the solder components attach to the surfaces of particles of the metal powder 14C.

Referring to FIG. 5D, Sn, which has formed the second electrode layer 20B, is taken in the bonding material 14. Specifically, molten Sn penetrates into the inside of the bonding material 14 through the gaps between particles of the metal powder 14C. Moreover, Sn comes in contact with the surfaces of particles of the metal powder 14C on which the intermetallic compound of the metal powder 14C with the solder is not formed. The intermetallic compound 14E containing Sn is formed on the surfaces of particles of the metal powder 14C. Accordingly, even if the electrode of the chip element 12B melts during the reflow process, molten electrode components are taken into the bonding material 14. Thus, a short circuit due to the outflow of the molten electrode components is prevented.

Further, the bonding material 14 mixed with the metal powder 14C has high viscosity even in a molten state. Therefore, a Manhattan phenomenon can be suppressed by fixing the chip-type elements by using the bonding material 14 of the embodiment. Here, the Manhattan phenomenon is a phenomenon in which an electrode on one side of a chip element rises during reflow.

Furthermore, the bonding material 14 containing a large amount of the metal powder 14C forms an irregular surface. Accordingly, the bonding strength between the bonding material 14 and the sealing resin, which seals the whole device, is increased. In addition, if the electrode of the chip element 12B does not melt during reflow, it is not necessary to increase the amount of the metal powder 14C as described above.

Next, a description will be given of a method of manufacturing the circuit devices structured as described in FIGS. 1A to 1C, with reference to FIGS. 6A to 10C. First, a description will be given of a method of manufacturing the circuit device 10A structured as shown in FIG. 1A, with reference to FIGS. 6A to 8.

Figure 6A:
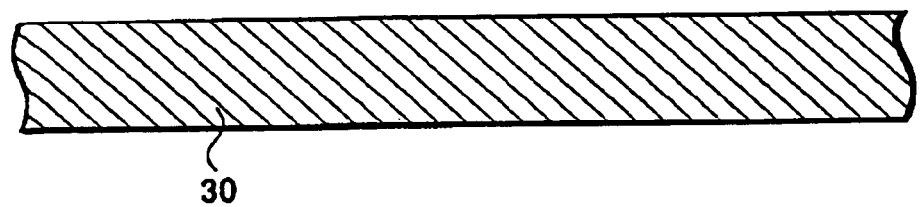
FIGS. 6A to 6C are sectional views showing a method of manufacturing the circuit devices of a preferred embodiment.
Figure 6B:
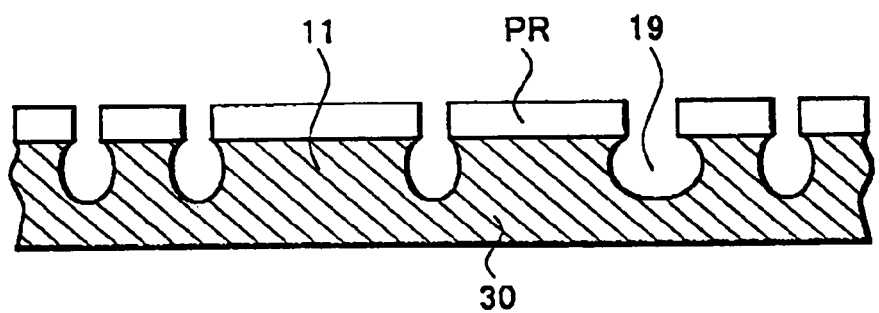
Figure 6C:
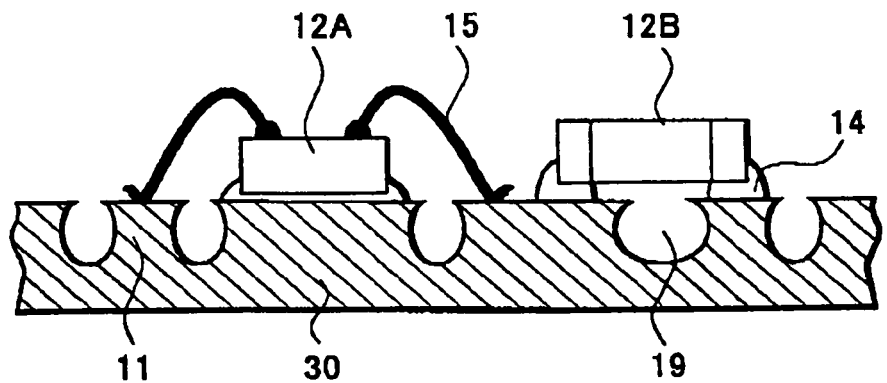

Referring to FIG. 6A first, conductive foil 30 made of metal, such as copper, is prepared. Next, as shown in FIG. 6B, etching resist PR is formed at portions which become conductive patterns. The isolation trenches 19 are formed by removing the surface of the conductive foil 30 exposing from the etching resist PR, using a removal method such as wet-etching. The conductive patterns 11 are formed in protruding patterns by the formation of the isolation trenches 19. Referring to FIG. 6C, the semiconductor element 12A and the chip element 12B are fixed to respective desired conductive patterns 11 through the bonding material 14. For the bonding material 14 used here, the aforementioned Pb-free solder essentially containing Bi can be used. Moreover, the solder mixed with the metal powder 14C as described with reference to FIGS. 4A and 4B can be also used. The electrodes on the surface of the semiconductor element 12A and the conductive patterns 11 are electrically connected to each other through the thin metal wires 15.

Figure 7A:
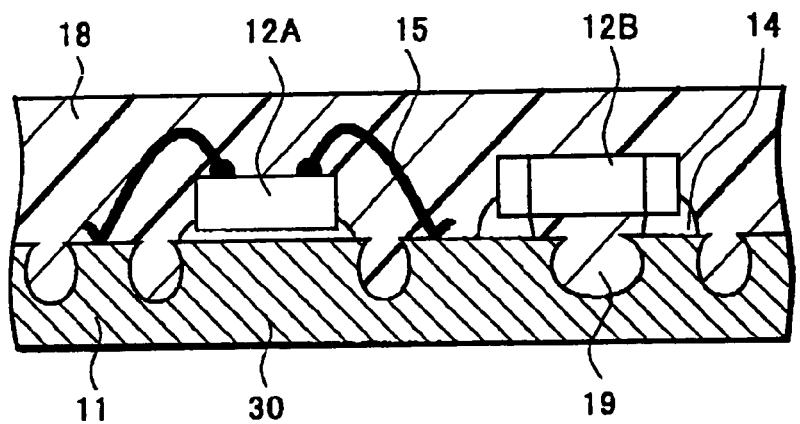
FIGS. 7A to 7C are sectional views showing the method of manufacturing the circuit device of a preferred embodiment.

Next, referring to FIG. 7A, the sealing resin 18 is formed so as to fill the isolation trenches 19 and cover the circuit elements. This formation of the sealing resin 18 can be performed by transfer-molding using thermosetting resin or by injection-molding using thermoplastic resin.

Figure 7B:
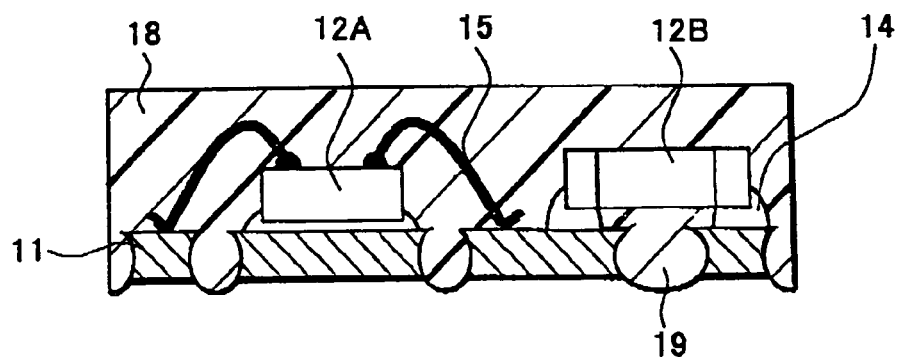
Figure 7C:
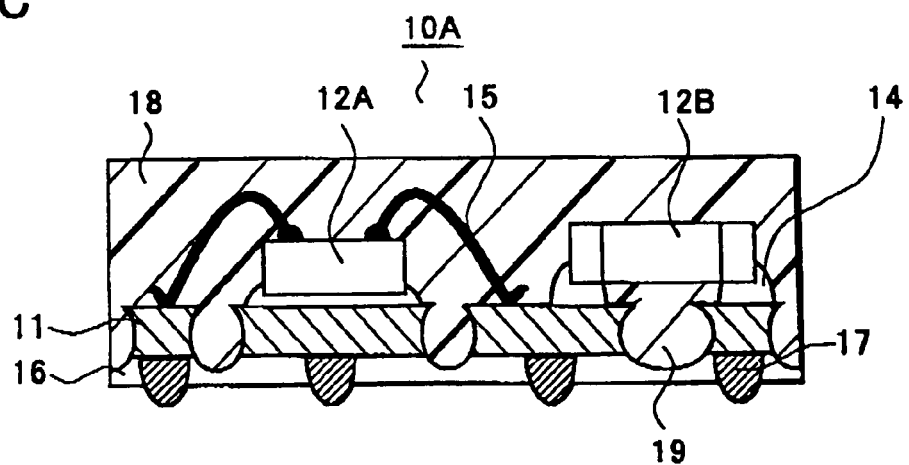

Next, referring to FIG. 7B, the sealing resin 18 filling the isolation trenches 19 is exposed at the back surface of the conductive foil 30 by removing the conductive foil 30 from the back surface overall. Thus, the conductive patterns 11 are electrically isolated from each other. Subsequently, resist 16 is formed, the external electrodes 17 are formed, and thus, the circuit device 10A as shown in FIG. 7C is completed.

Figure 8:
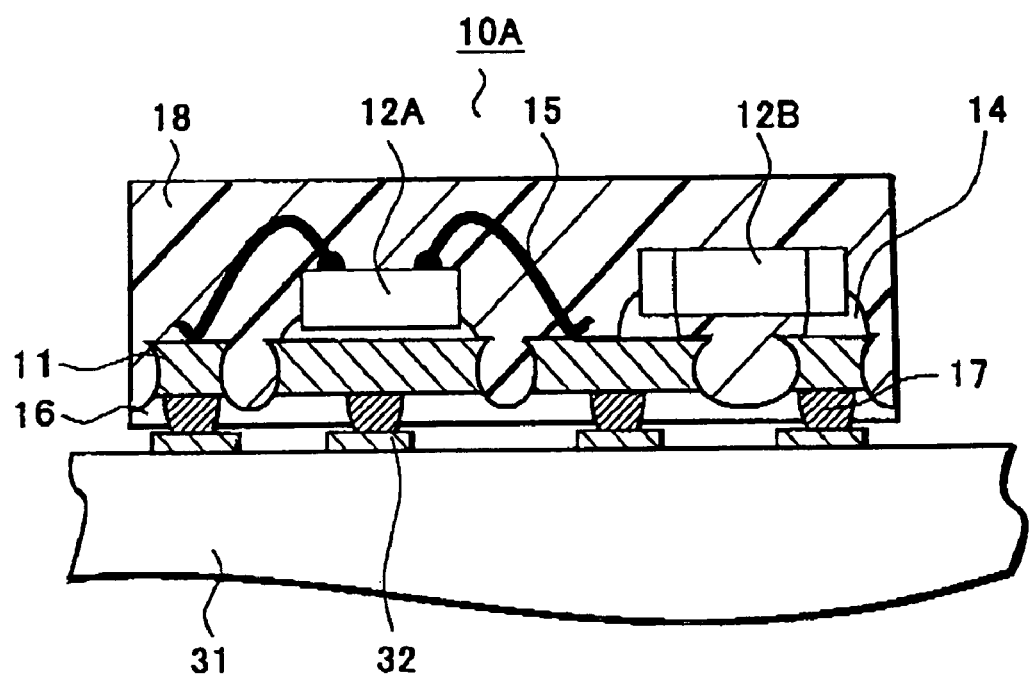
FIG. 8 is a sectional view showing the method of manufacturing the circuit device of a preferred embodiment.

Next, referring to FIG. 8, the circuit device 10A manufactured through the above-described processes is fixed to conductive paths 32 on a mounting substrate 31. This can be done by a reflow process. That is, the circuit device 10A is mounted by increasing the temperature of atmosphere at the circuit device 10A up to a temperature at which the solder forming the external electrodes 17 melts. Here, even if a Pb-free solder having a high melting temperature is employed as an external electrode for constituting the external electrodes 17, it is possible to avoid problems caused by the bonding material 14. Specifically, the fact that the bonding material 14 is made of a solder essentially containing Bi can prevent the bonding material 14 from being melted by a reflow process. This is because the melting temperature of Bi is higher than the reflow temperature. Moreover, the fact that metal powder is mixed into the bonding material 14 can suppress the occurrence of cracks in the resin even when the solder contained in the bonding material 14 melts in a reflow process. This is because most of the solder components contained in the bonding material 14 become the intermetallic compound on the surfaces of particles of the metal powder and therefore only small amounts of the solder components melt.

Next, a description will be given of the structure of the circuit device 10C having a multilayer structure shown in FIG. 1C, with reference to FIGS. 9A to 10C. First, referring to FIG. 9A, a multi-layer sheet is prepared in which first conductive foil 33 and second conductive foil 34 are layered. Subsequently, referring to FIG. 9B, the first conductive patterns 11A are formed by selectively removing the first conductive foil 33. Moreover, desired portions of the first conductive patterns 11A and the second conductive foil 34 are connected to each other by allowing them to penetrate the insulating layer 22.

Figure 9A:
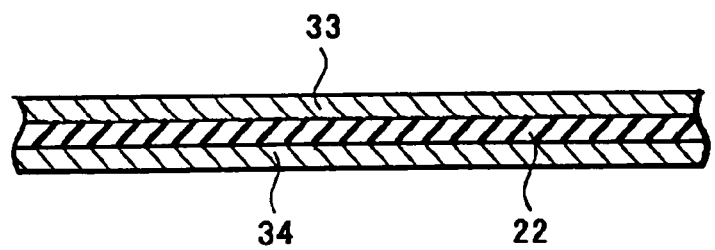
FIGS. 9A to 9C are sectional views showing a method of manufacturing the circuit devices of a preferred embodiment.
Figure 9B:
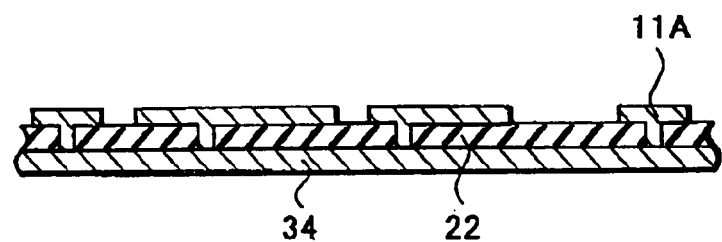
Figure 9C:
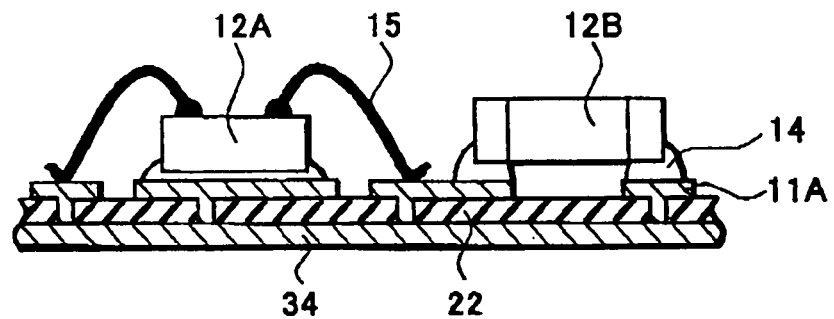
Figure 10A:
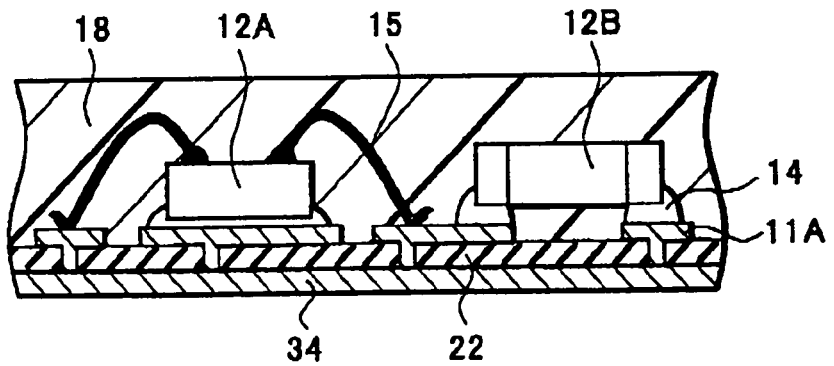
FIGS. 10A to 10C are sectional views showing the method of manufacturing the circuit device of a preferred embodiment.

Next, referring to FIG. 9C, the semiconductor element 12A and the chip element 12B are fixed to the first conductive patterns 11A by using the bonding material 14. Referring to FIG. 10A, the sealing resin 18 is formed so as to cover the semiconductor element 12A and the chip element 12B.

Figure 10B:
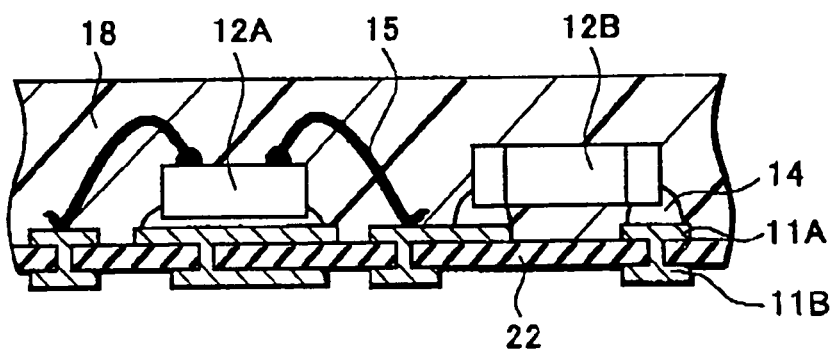
Figure 10C:
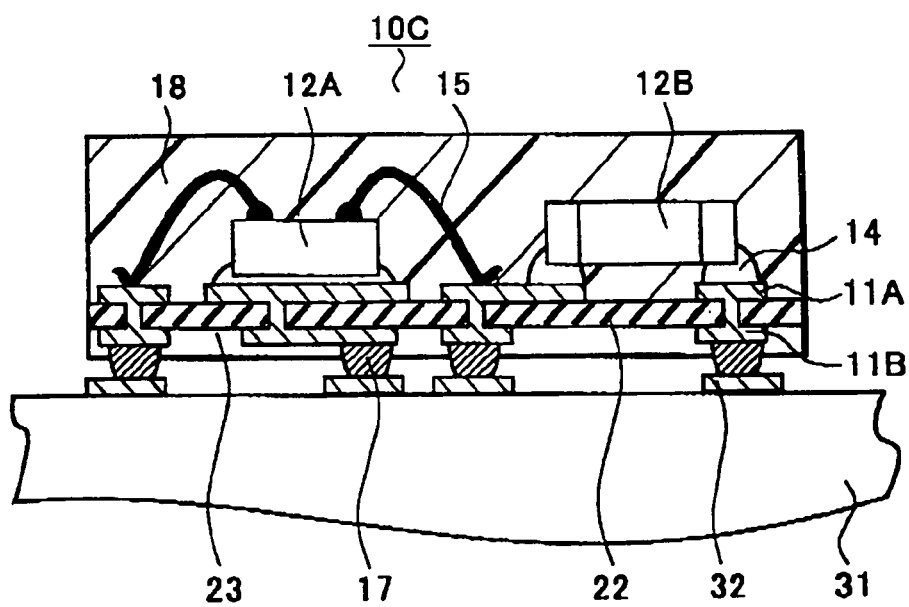
Figure 11:
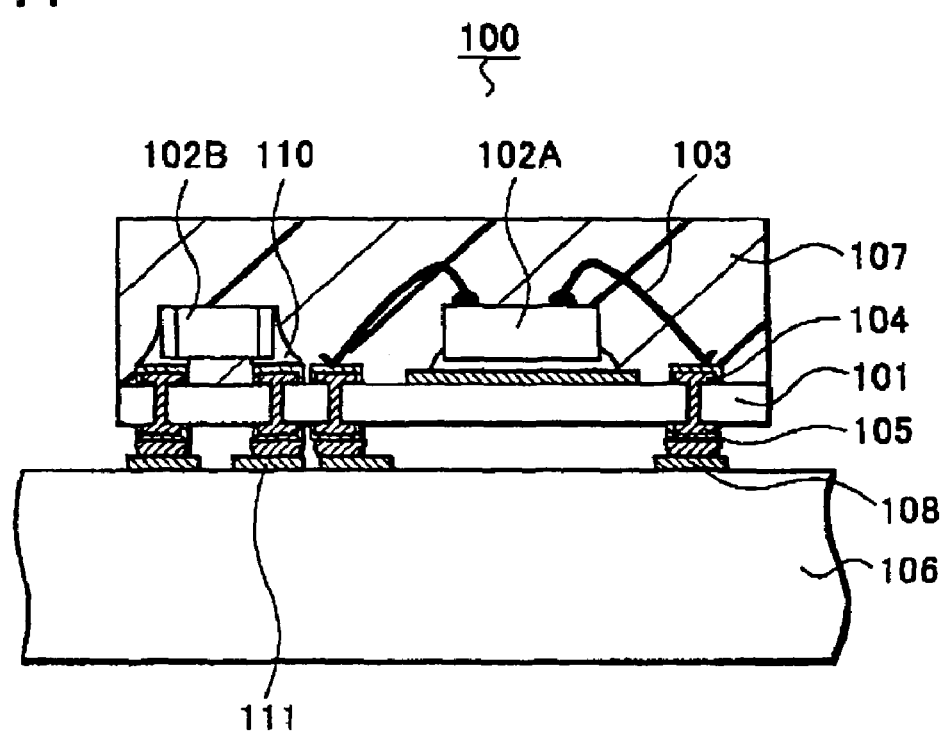
FIG. 11 is a sectional view showing a conventional circuit device.

Referring to FIG. 10B, the second conductive patterns 11B are formed by partially removing the second conductive foil 34 on the back surface. Further, resist 23 and the external electrodes 17 are formed on the back surface, and thus the circuit device 10C as shown in FIG. 1C is completed. Thereafter, the circuit device 10C is mounted on the mounting substrate 31 by a reflow process, thus obtaining the mounting structure shown in FIG. 10C. The mounting of the circuit device is performed in a similar manner to the process shown in FIG. 8.

Apart from the aforementioned circuit devices, the bonding material of the embodiment can be applied to circuit devices of other types. For example, it is possible to apply the bonding material of the embodiment to a circuit device using a lead frame. In this case, a circuit element is bonded to the lead frame through the bonding material of the present application. Specifically, the bonding material of the present application can be applied to a QFP (Quad Flat Package), a QFN (Quad Flat Non-leaded package), and the like. Furthermore, it is also possible to apply the bonding material of the embodiment to the external electrodes 17.

What is claimed is:

1. A circuit device comprising:
    a circuit element;
    a conductive pattern; and
    a bonding material which bonds the circuit element to the conductive pattern,
    wherein the bonding material is mainly made of Bi and contains 90% or more by weight of Bi; and
    wherein the conductive pattern is externally, electrically connected using a Pb-free solder.

2. The circuit device according to claim 1, wherein the circuit element, the conductive pattern and the bonding material are covered with a sealing resin.

3. The circuit device according to claim 1, further comprising:
    an external electrode fixed to the conductive pattern,
    wherein the external electrode is made of Pb-free solder.

4. The circuit device according to claim 1, wherein the bonding material contains Bi, Ag and Cu.

5. The circuit device according to claim 3,
    wherein the conductive pattern has a multilayer structure in which a plurality of layers are laminated with an insulating layer, made of resin, interposed therebetween, and
    wherein a melting temperature of the bonding material is higher than a melting temperature of the external electrode, and is lower than a temperature at which the insulating layer is thermally decomposed.

6. The circuit device according to claim 1 further comprising sealing resin to seal the bonding material, wherein the sealing resin is adapted to compensate for brittleness of the bonding material.

7. The circuit device according to claim 1 wherein the bonding material comprises a flux containing a resin.

8. The circuit device of claim 1 wherein the bonding material consists essentially of Bi.

9. A circuit device comprising:
    a circuit element;
    a conductive pattern;
    a bonding material which bonds the circuit element to the conductive pattern, wherein the bonding material comprises a solder powder and a metal powder in a weight ratio between 1:1 and 3:2, wherein the metal powder comprises a metal;
    wherein a melting temperature of the metal powder is higher than a melting point of the bonding material; and
    wherein the metal in the metal powder forms an intermetallic compound with a metal in the bonding material when mixed together.

10. The circuit device according to claim 9, wherein at least any one of Cu, Ni, Fe, Al, Ag, Au, Sb, and Bi is employed as the metal powder.

11. The circuit device according to claim 9, wherein the metal powder includes particles of different sizes.

12. The circuit device according to claim 9,
    wherein the circuit element is a chip-type element with electrode layers formed on both ends thereof,
    the electrode layers and the conductive pattern are connected to each other through the bonding material, and
    at least part of the electrode layers is integrated with the bonding material.

13. The circuit device according to claim 9, wherein the circuit element, the conductive pattern and the bonding material are covered with a sealing resin.

14. The circuit device according to claim 9, wherein the metal powder remains as solid.

15. The circuit device according to claim 9 wherein the bonding material comprises a flux containing a resin.

16. The circuit device according to claim 9 wherein the intermetallic compound is formed around the metal powder.

17. A bonding material consisting essentially of solder, and metal powder mixed into the solder,
    wherein a melting temperature of the metal powder is higher than a melting temperature of the solder; and
    wherein the metal powder comprises a metal that, when mixed with the solder, forms an intermetallic compound with a metal in the solder, wherein the solder powder and metal powder are mixed in a weight ratio between 1:1 and 3:2.

18. The bonding material according to claim 17, wherein, for the metal powder, a metal selected from the group consisting of Cu, Ni, Fe, Al, Ag, Au, Sb, and Bi is employed.

19. The bonding material according to claim 17, wherein the metal powder includes particles with different sizes.

20. A bonding material consisting essentially of solder, and metal powder mixed into the solder, wherein the metal powder comprises a metal that, when mixed with the solder, forms an intermetallic compound with a metal in the solder, and wherein the metal powder includes particles with different sizes and wherein the solder and metal powder are mixed in a weight ratio between 1:1 and 3:2.

21. A circuit device comprising:
    a circuit element;
    a conductive pattern, wherein the conductive pattern is externally, electrically connected using a Pb-free solder and has a multilayer structure in which a plurality of layers are laminated with an insulating layer, made of resin, interposed therebetween;
    a bonding material which bonds the circuit element to the conductive pattern, wherein the bonding material is mainly made of Bi and contains 90% or more by weight of Bi; and
    an external electrode fixed to the conductive pattern, wherein a melting temperature of the bonding material is higher than a melting temperature of the external electrode, and is lower than a temperature at which the insulating layer is thermally decomposed.

* * * * *